US006287734B2

(12) United States Patent
Imai

(10) Patent No.: US 6,287,734 B2
(45) Date of Patent: Sep. 11, 2001

(54) EXPOSURE METHOD

(75) Inventor: Yuji Imai, Saitama-ken (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/739,627

(22) Filed: Dec. 20, 2000

Related U.S. Application Data

(63) Continuation of application No. 09/333,985, filed on Jun. 16, 1999, which is a continuation of application No. 09/179,883, filed on Oct. 28, 1998, now abandoned, which is a continuation of application No. 08/679,280, filed on Jul. 12, 1996, now abandoned.

(30) Foreign Application Priority Data

| Jul. 13, 1995 | (JP) | ................................... 7-177328 |
| Jan. 25, 1996 | (JP) | ................................... 8-010790 |
| Jun. 6, 1996  | (JP) | ................................... 8-043951 |

(51) Int. Cl.$^7$ ....................................................... G03F 9/00
(52) U.S. Cl. ............................................... 430/22; 430/30
(58) Field of Search ........................................ 430/22, 30

(56) References Cited

U.S. PATENT DOCUMENTS

| 4,558,949 | 12/1985 | Uehara et al. | 356/152 |
| 5,361,122 | 11/1994 | Kataoka et al. | 355/53 |
| 5,443,932 | 8/1995 | Ohta et al. | 430/22 |
| 5,448,332 | 9/1995 | Sakakibara et al. | 355/53 |
| 5,461,237 | 10/1995 | Wakamoto et al. | 250/548 |
| 5,468,580 | 11/1995 | Tanaka | 430/22 |
| 5,521,036 | 5/1996 | Iwamoto et al. | 430/22 |
| 5,569,570 | 10/1996 | Balzer | 430/22 |
| 5,693,439 | 12/1997 | Tanaka et al. | 430/30 |
| 5,796,467 | 8/1998 | Suzuki | 355/53 |

FOREIGN PATENT DOCUMENTS

| 58-103136 | 6/1983 | (JP) . |
| 61-048923 | 3/1985 | (JP) . |
| 61-287229 | 12/1986 | (JP) . |
| 4-350925 | 4/1992 | (JP) . |

*Primary Examiner*—Christopher G. Young
(74) *Attorney, Agent, or Firm*—Armstrong, Westerman, Hattori, McLeland & Naughton, LLP

(57) ABSTRACT

An exposure method for a photolithographic process uses a projection exposure apparatus including a projection optical system. The surface of a first shot area on a wafer is caused to be coincident with an image plane of the projection optical system within an exposure field thereof so as to achieve focused condition, and an image of a reticle pattern is transferred onto the first shot area. Then, a second shot area is moved into the exposure field, during which the vertical position of the wafer is corrected by means of a Z/levelling-stage so as to compensate for the variation in the vertical position of the wafer W which could otherwise occur depending on the angle formed between the running plane of the wafer stage and the image plane. Then, an AF sensor system is used to measure and store a defocus amount of the second shot area relative to the image plane. Then, focusing and exposure are performed for the second shot area. This procedure is repeated for the shot areas on the wafer so as to obtain a plurality of defocus amounts, from which any foreign matter existing on the bottom of the wafer are detected. In another embodiment, the vertical position and tilt angle of the wafer are caused to be coincident with those of the image plane, and the first shot area is exposed. Then, the wafer is moved so as to position the second shot area into the exposure field, during which the tilt angle of the surface of the wafer is kept unchanged. Then, the tilt angle of the wafer is measured and stored. Thereafter, the vertical position and tilt angle of the wafer are caused to be coincident with those of the image plane, and the second shot area is exposed. Foreign matter are detected from a distribution of the tilt angles on the surface of the wafer.

21 Claims, 10 Drawing Sheets

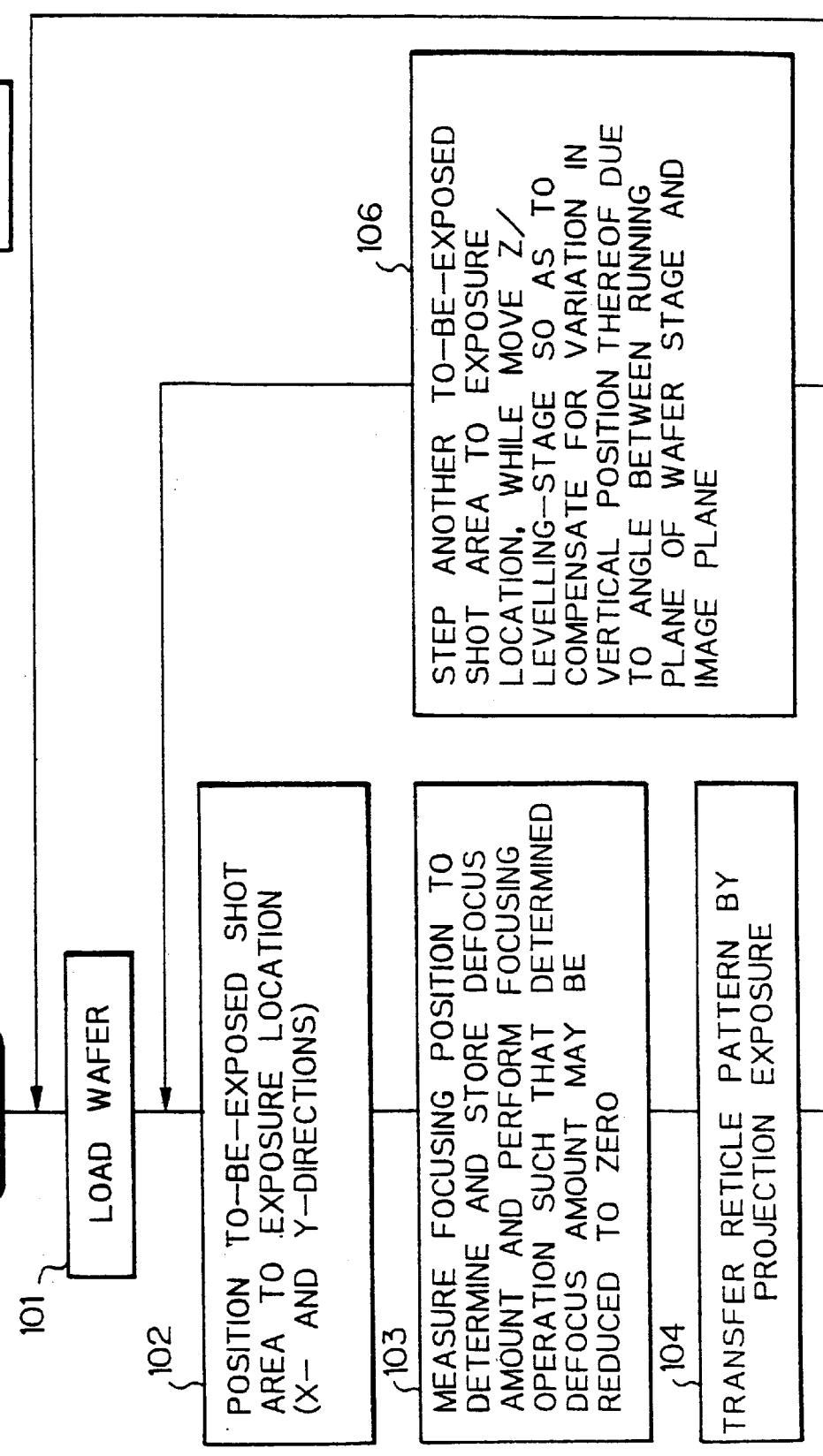

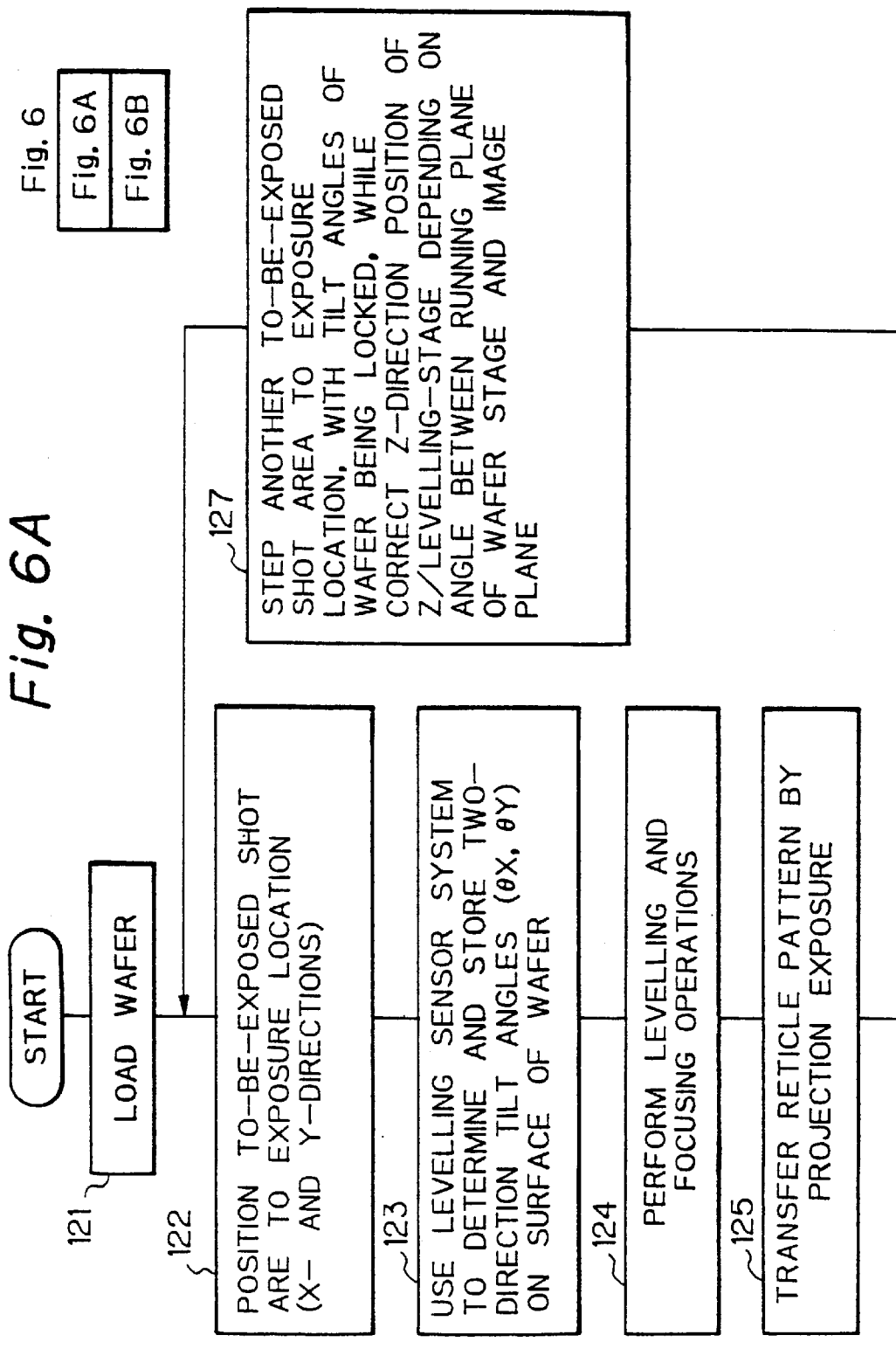

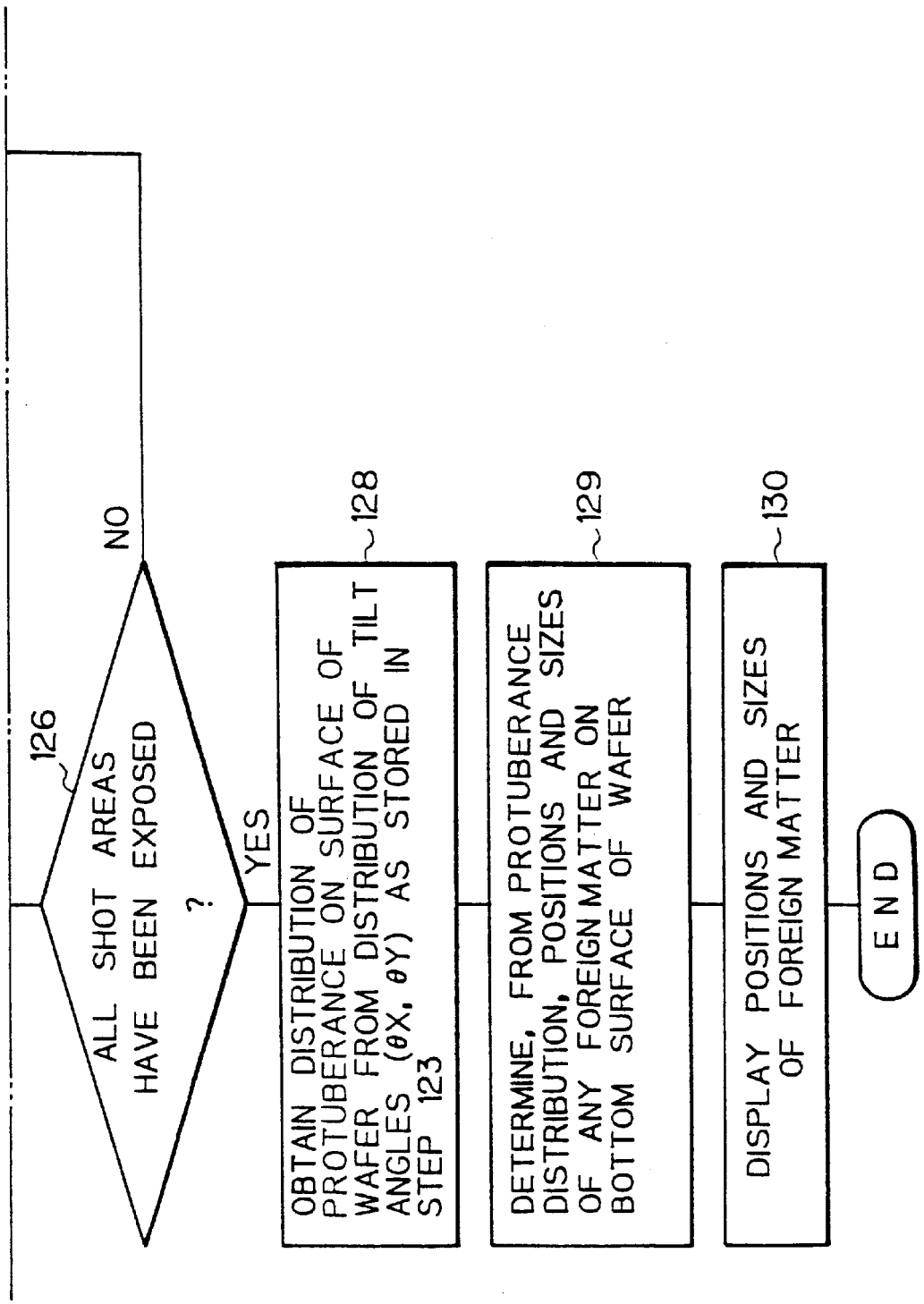

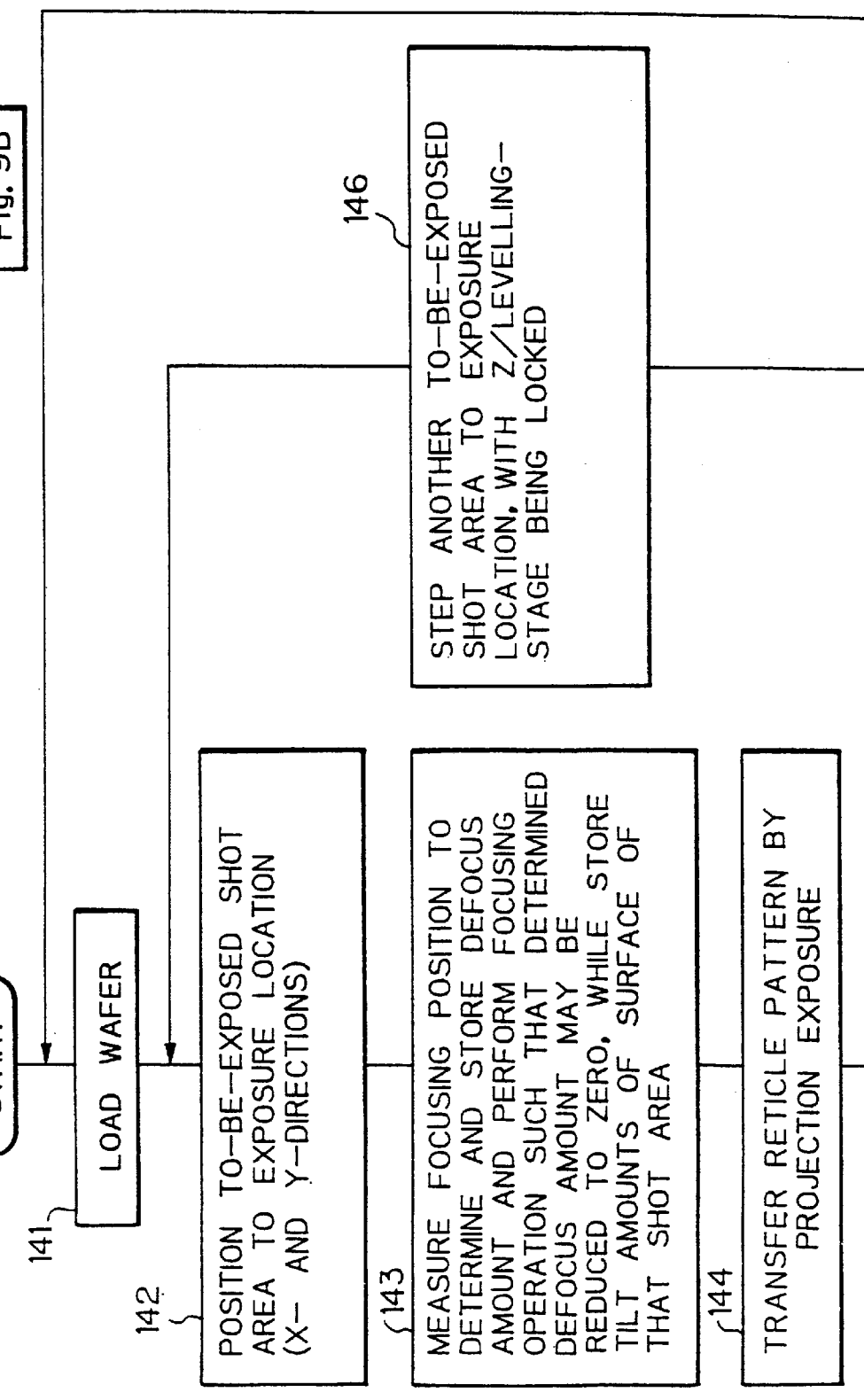

EXPOSURE METHOD

This application is a Continuation of prior application Ser. No. 09/333,985, filed Jun. 16, 1999, which is a Continuation of prior application Ser. No. 09/179,883, filed Oct. 28, 1998 (which is now Abandoned), which is a Continuation of prior application Ser. No. 08/679,280 filed Jul. 12, 1996 (which is now Abandoned).

BACKGROUND OF THE INVENTION

1. Field of the Invention

The present invention relates to an exposure method, used with a projection exposure apparatus, for fabricating semiconductor devices, image sensing devices (such as charge-coupled devices), liquid crystal displays, thin film magnetic heads or the like. More particularly, it relates to an exposure method suitable for use with a projection exposure apparatus which is equipped with an auto-focusing mechanism for positioning the surface of a photosensitized substrate to cause it to be coincident with an image plane of a projection optical system of the projection exposure apparatus.

2. Description of the Related Art

In photolithographic process for fabricating semiconductor devices or other products, a projection exposure apparatus (such as a stepper) is commonly used in which an image of a pattern on a mask or reticle is transferred through a projection optical system onto each of a plurality of shot areas defined on a photoresist-coated wafer (or other substrate such as a glass plate). In a projection exposure apparatus, the wafer may be held against a top surface of a wafer holder utilizing vacuum, and the top surface of the wafer may have a relief pattern of concentric circles. In addition, such a projection exposure apparatus may include an auto-focusing mechanism comprising an auto-focus sensor system and a stage mechanism. The auto-focus sensor system detects a focusing position (or vertical position) of the surface of the wafer at a measurement point which may be selected, for example, to be at the center of an exposure field of the projection optical system. The stage mechanism uses the detection results from the auto-focus sensor system so as to position the surface of the wafer in each shot area to locate the surface close to and within a range of focal depth about an image plane of the projection optical system.

In a prior art auto-focusing mechanism of this type, calibration is achieved such that the auto-focus sensor system provides a detection signal at a predetermined reference level when the surface of the wafer is coincident with the image plane of the projection optical system. Further, in order to maintain focusing during an exposure operation by an auto-focus technique, a servo-control technique is used to control the focusing position of the wafer through the stage mechanism such that the detection signal from the auto-focus sensor system remains substantially at the reference level.

As described, in this prior art auto-focusing system, the focusing position of the wafer at a preselected measurement point in the exposure field is caused to be coincident with the image plane whose position is known. Thus, if there is a protuberance of the surface of the wafer at a position near the measurement point in the shot area to be exposed, which may occur due to the intrusion of foreign matter, such as a residue of photoresist or a dust particle, between the bottom surface of the wafer and the top surface of the wafer holder, then only the region of the protuberance may be made coincident with the image plane with the result that the remaining large portion of that shot area is positioned unacceptably far from the image plane. Consequently, the chip pattern formed in that shot area will be defective. However, until now, it has been impossible to detect any such defective chip patterns caused by foreign matter before checking the integrity of chip patterns on wafers for after the entire fabrication process has been completed.

If such foreign matter can be detected, useless exposure operations may be eliminated. Specifically, if large foreign matter is detected in a particular shot area during the exposure process for the first level layer on the wafer, exposure operations can be omitted for that shot area during the exposure processes for the second and any subsequent level layers.

Nevertheless, adding a detection device specifically designed for foreign matter detection purpose to the projection exposure apparatus would result in a complication of the arrangement of the wafer stage and hence in an increase in the manufacturing costs.

In view of the foregoing, it is an object of the present invention to provide an exposure method which is capable of detecting foreign matter existing on the bottom of a wafer without the need for any special detection device.

SUMMARY OF THE INVENTION

According to a first aspect of the present invention, there is provided an exposure method in which positioning of a substrate is performed by means of a substrate stage and in which a mask pattern is sequentially projected onto a plurality of shot areas on the substrate through a projection optical system, the method comprising: a first step including causing a first shot area on the substrate to be set in an exposure field of the projection optical system, causing the surface of the substrate and an image plane of the projection optical system to be coincident with each other at a predetermined measurement point in the exposure field so as to achieve focused condition, and transferring the mask pattern onto the first shot area by projection exposure; a second step including moving the substrate along a predetermined running plane by means of the substrate stage so as to cause a second shot area on the substrate to be set in the exposure field of the projection optical system, adjusting vertical position of the substrate by means of the substrate stage so as to compensate for any offset between the running plane and the image plane of the projection optical system, and measuring and storing a defocus amount between the surface of the substrate and the image plane of the projection optical system at the predetermined measurement point; and a third step including causing the surface of the substrate and the image plane of the projection optical system to be coincident with each other at the predetermined measurement point so as to achieve focused condition, and transferring the mask pattern onto the second shot area by projection exposure.

This exposure method may preferably further comprise the steps of: repeating the second step and the third step for a plurality of shot areas on the substrate so as to obtain a plurality of defocus amounts; and detecting from the plurality of defocus amounts the existence of any foreign matter existing between the substrate and the substrate stage.

Further, this exposure method may further comprise the steps of: repeating the second step and the third step so as to obtain a plurality of defocus amounts; obtaining from the plurality of defocus amounts a distribution of tilt angles on the surface of the substrate; determining, by calculation, from the distribution thus obtained, positions and size of any foreign matter existing between the substrate and the substrate stage; and displaying the positions and size of foreign matter thus determined on a display.

According to a second aspect of the present invention, there is provided an exposure method in which positioning of a substrate is performed by means of a substrate stage and in which a mask pattern is sequentially projected onto a plurality of shot areas on the substrate through a projection optical system, the method comprising: a first step including causing a first shot area on the substrate to be set in an exposure field of the projection optical system, adjusting vertical position and tilt angle of the surface of the substrate to those of an image plane of the projection optical system, and transferring the mask pattern onto the first shot area by projection exposure; a second step including moving the substrate along a predetermined running plane by means of the substrate stage with tilt angle of the substrate being kept unchanged so as to cause a second shot area on the substrate to be set in the exposure field, measuring and storing tilt angle of the surface of the substrate relative to the image plane in the exposure field, and thereafter adjusting vertical position and tilt angle of the surface of the substrate to those of the image plane and transferring the mask pattern onto the second shot area by projection exposure; a step of repeating the second step for a plurality of shot areas on the substrate so as to obtain a distribution of a plurality of tilt angles and using the distribution so as to detect any foreign matter existing between the substrate and the substrate stage.

According to a third aspect of the present invention, there is provided an exposure method in which positioning of a substrate is performed by means of a substrate stage and in which a mask pattern is sequentially projected onto a plurality of shot areas on the substrate through a projection optical system, the method comprising: a first step including causing a first shot area on the substrate to be set in an exposure field of the projection optical system, adjusting a vertical position of the surface of the substrate to that of an image plane of the projection optical system, storing tilt amount of the surface of the substrate relative to the image plane, and transferring the mask pattern onto the first shot area by projection exposure; a second step including moving the substrate along a predetermined running plane by means of the substrate stage with tilt of the substrate being kept unchanged so as to cause a second shot area on the substrate to be set in the exposure field of the projection optical system, and measuring and storing a defocus amount between the surface of the substrate and the image plane of the projection optical system at a predetermined measurement point; and a third step including making the surface of the substrate and the image plane of the projection optical system coincident with each other at the predetermined measurement point so as to achieve focusing condition, and transferring the mask pattern onto the second shot area by projection exposure.

In this exposure method, the tilt amount may be determined, by calculation, from i) tilt angle of the shot area relative to the image plane and ii) spacing between the shot areas.

This exposure method may preferably further comprise the steps of: repeating the first step, the second step and the third step for a plurality of shot areas on the substrate so as to obtain a plurality of defocus amounts; and detecting from the plurality of defocus amounts the existence of any foreign matter between the substrate and the substrate stage.

Moreover, this exposure method may further comprise the steps of: repeating the first step, the second step and the third step so as to obtain a plurality of tilt amounts and a plurality of defocus amounts; obtaining, from the plurality of tilt amounts and the plurality of defocus amounts, distributions of tilt amounts and defocus amounts on the surface of the substrate; determining, by calculation, from the distributions thus obtained, positions and size of any foreign matter existing between the substrate and the substrate stage; and displaying the positions and size of foreign matter thus determined on a display.

In the exposure method according to the first aspect of the present invention described above, for example, in the first step when the first shot area on the substrate is exposed, a point P in the first shot area is caused to be coincident with the image plane, as shown in FIG. 3(a). Then in the second step, in order to expose the second shot area on the substrate, the substrate stage is moved along the predetermined running plane to cause the second shot area to be set in the exposure field, as shown in FIGS. 3(a) and 3(b). This movement of the substrate stage produces a variation $\delta(\approx L*\theta)$ in the focusing position of the substrate, where $\theta$ stands for the known value of the tilt angle of the running plane relative to the image plane and L stands for the distance covered by the movement of the substrate stage.

Accordingly, the focusing position is adjusted so as to compensate for the variation $\delta$, by operating the substrate stage, as shown in FIG. 3(c). This causes a point Q in the second shot area to be coincident with the image plane so as to achieve focused condition provided that the substrate is flat. However, if there is foreign matter between the substrate and the substrate stage as shown in FIG. 3(d), a non-zero defocus amount $\Delta Z$ is measured between the point Q and the image plane. Therefore, any foreign matter existing on the bottom surface of the substrate may be detected by using an ordinary auto-focus sensor system to measure the defocus amount $\Delta Z$.

In this method, the second step and the third step may be repeated so as to obtain a plurality of defocus amounts, from which a distribution of tilt angles on the surface of the substrate may be obtained. The distribution of the tilt angles indicates a peak at a position where a large foreign matter exists on the bottom surface of the substrate. Thus, positions and size of any foreign matter on the bottom surface of the substrate may be determined, by calculation, from the distribution of the tilt angles, and the positions and the sizes of foreign matter thus determined may be displayed on a display.

In the exposure method according to the second aspect of the present invention described above, for example, in the first step the first shot area on the substrate is set parallel to the image plane, and in the second step the second shot area is set in the exposure field with the tilt angle of the substrate being kept unchanged. If there is foreign matter on the bottom surface of the substrate at a position corresponding to or near the second shot area, a certain tilt angle of the surface of the second shot area relative to the image plane is detected. By repeating the second step, a distribution of the tilt angles of the substrate due to foreign matter is detected. Thus, positions and size of any foreign matter may be determined from the distribution of the tilt angles. Since the tilt angles of the surface of the substrate may be detected by means of an ordinary levelling sensor, it is unnecessary to use any special detection device designed for foreign matter detection purpose.

In the exposure method according to the third aspect of the present invention described above, for example, in the first step when the first shot area on the substrate is exposed, a point P in the first shot area is caused to be coincident with the image plane and the tilt amount of the surface of the shot area relative to the image plane is measured, as shown in FIG. 3(a). Then in the second step, in order to expose the second shot area on the substrate, the substrate stage is moved along the predetermined running plane to cause the second shot area to be set in the exposure field, as shown in FIGS. 3(a) and 3(b). This movement of the substrate stage produces a variation $\delta(\approx L*\theta)$ in the focusing position of the substrate, where $\theta$ stands for the known value of the tilt angle of the running plane relative to the image plane and L stands for the distance covered by the movement of the substrate stage. Accordingly, the variation $\delta$ is determined from i) the tilt amount $\theta$ which has been measured for the first shot area and ii) the distance L covered by the movement of the substrate stage (or the step pitch) and stored. Then, the defocus amount ($\Delta Z'$) at the point Q is measured and a calculation $\Delta Z = \Delta Z' - \delta$ is performed. If the substrate is flat, we obtain $\Delta Z = 0$. However, if foreign matter exists between the substrate and the substrate stage as shown in FIG. 3(d), a non-zero defocus amount $\Delta Z$ is measured between the point Q and the image plane, so that it is determined that foreign matter may exist.

In this method, the first step, the second step and the third step may be repeated so as to obtain a plurality of defocus amounts, from which a distribution of the defocus amounts on the surface of the substrate may be obtained. Therefore, positions and size of any foreign matter on the bottom surface of the substrate may be determined, by calculation, from the distribution of the defocus amounts, and the positions and the sizes of foreign matter thus determined may be displayed on a display.

BRIEF DESCRIPTION OF THE DRAWINGS

The above and other objects, features and advantages of the present invention will be apparent from the following detailed description of preferred embodiments thereof, reference being made to the accompanying drawings, in which:

FIGS. 1A and 1B combined, form a flow chart illustrating an exposure procedure according to a first embodiment of the present invention;

FIGS. 6A and 6B, combined, form a flow chart illustrating the exposure procedure according to the second embodiment of the present invention;

FIGS. 9A and 9B, combined, form a flow chart illustrating an exposure procedure according to a third embodiment of the present invention.

DETAILED DESCRIPTION OF PREFERRED EMBODIMENTS

Referring now to the accompanying drawing, and in particular to FIGS. 1 to 4, a first embodiment of the present invention will be described in detail.

Figure 2:
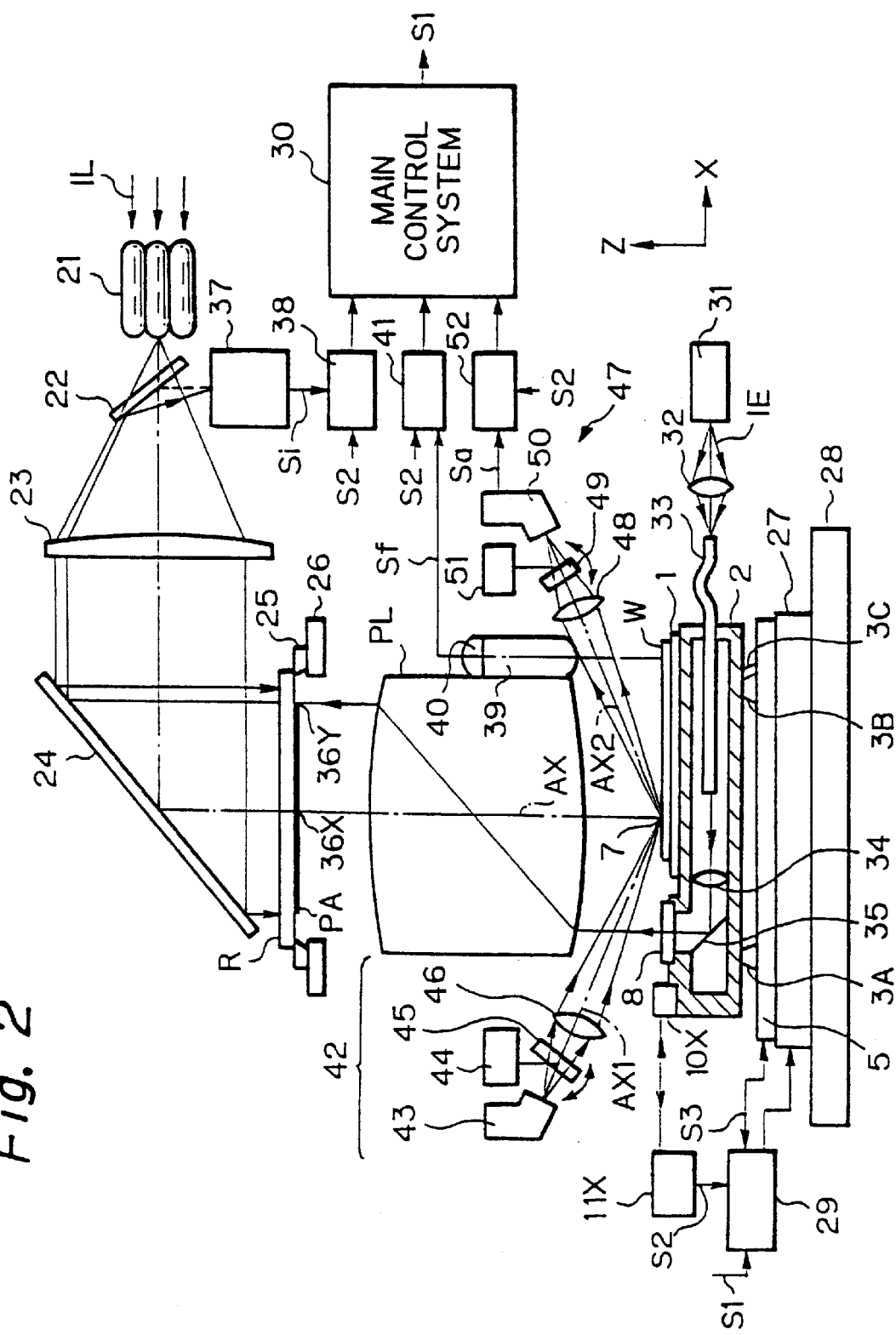
FIG. 2 is a schematic representation, partially cutout, of a projection exposure apparatus which may be used for implementing exposure procedures according to embodiments of the present invention.

FIG. 2 is a schematic representation showing a critical part of a projection exposure apparatus used for implementing the method of the embodiment. As shown, an illumination light beam IL, which is used for exposure, is emitted form a light source (not shown) into a fly-eye lens 21. The illumination beam IL may comprise G-line light or I-line light in the line spectrum of a mercury-vapor lamp, or alternatively may comprise ultraviolet light pulses obtainable from an excimer laser source. The fly-eye lens 21 has an exit surface on which a number of light source images are formed. Light rays from the light source images together form again the illumination beam IL, a large part of which passes through a beam splitter 22 having a great transmittance and a small reflectance, then through a condenser lens 23, and is reflected by a mirror 24 so as to illuminate a pattern bearing area PA of a reticle R with a uniform illuminance over the entire area PA. The reticle R is held on a reticle stage 26 through a reticle holder 25. The reticle stage 26 is capable of positioning the reticle R within a predetermined positioning range. The two-dimensional location and the rotational angle (or orientation) of the reticle stage 26 are measured by laser interferometers (not shown) in a way well known in the art, and the measurement results are supplied to a main control system 30 which provides general control of the operations carried out in the entire projection exposure apparatus.

Having passed through the pattern bearing area PA of the reticle R, the illumination beam IL is projected onto a wafer W through a projection optical system PL so as to form an image of the pattern bearing area PA of the reticle R on the wafer W. The projection optical system PL is a both-side-telecentric system (or, alternatively, it may be a single-side-telecentric system). The wafer W is held on a material support 2 through a wafer holder 1, and the material support 2, in turn, is carried on a Z/levelling-stage 5 through three adjustable supports 3A, 3B and 3C which are independently extendible/contractible in the Z-direction. The Z/levelling-stage 5 is carried on an XY-stage 27 which, in turn, is carried on a base 28. The material support 2, the adjustable supports 3A–3C, the Z/levelling-stage 5, the XY-stage 27 and the base 28 together form a wafer stage. In order to specify directions and positions in this arrangement, we define here a three-dimensional, rectangular, XYZ-coordinate system with the Z-axis extending parallel to the optical axis AX of the projection optical system PL, the X-axis perpendicular to the Z-axis and parallel to the paper surface of FIG. 2 and the Y-axis perpendicular to the paper surface of FIG. 2.

A reference mark bearing member 8 is fit in a recess formed in the material support 2 at a position adjacent one of the side edges of the wafer holder 1 carried on the material support 2. The reference mark bearing member 8 has its top surface so located as to be substantially level with the top surface of the wafer W. The reference mark bearing member 8 comprises a transparent glass plate having an opaque layer coated on its top surface, and reference marks are formed in the opaque layer, that is, each reference mark comprises an opening formed in the opaque layer so as to allow a light beam to pass through it. The material support 2 is provided with an X-axis moving mirror 10X (this term means that it is a moving mirror used for measurement of positions in the X-direction) fixedly mounted on the support 2 along a first one of the side edges of the support 2, as well as a Y-axis moving mirror (not shown) fixedly mounted on the support 2 along a second one of the side edges of the support 2 extending perpendicular to the first side edge. There are provided an X-axis laser interferometer 11X (this term means that it is a laser interferometer used for measure-ment of positions in the X-direction) and a Y-axis laser interferometer (not shown), which are mounted at suitable locations external to the material support 2, facing to the X-axis and Y-axis movable mirrors, respectively. These laser interferometers serve to continuously measure the two-dimensional coordinates (X, Y) of the position of the material support 2 with a high resolution of the order of 0.01 μm, for example.

Each of the three adjustable supports 3A–3C may comprise a mechanism composed of a ball and a cam mechanism for moving the ball in the Z-direction (or the vertical direction), or alternatively may comprise an extendible/contractible driving element such as a piezo-electric device. The material support 2 may be displaced (or translated) relative to the Z/levelling-stage 5 by a desired distance in the Z-direction, by simultaneously extending/contracting the three adjustable supports 3A–3C by the same amount. On the other hand, the material support 2 may be so tilted as to make a two-axis tilt movement by any desired angle in any desired direction, by extending/contracting the three adjustable supports 3A–3C by different amounts. In order to enable the above, the relationship between i) the extension/contraction amounts of the respective adjustable supports 3A–3C and ii) the combination of the Z-direction displacements and the tilt angles of the material support 2 is derived and stored in the course of initialization process of the projection exposure apparatus.

As shown in FIG. 2, the XY-stage 27 is carried on the base 28 for movement in both the X- and Y-directions, and position information signals S2 indicating the two dimensional coordinates (X, Y) of the material support 2 as measured by the X-axis laser interferometer 11X and the Y-axis laser interferometer (not shown) and vertical position information signals S3 indicating the extension/contraction amounts of the three adjustable supports 3A–3C are supplied to a stage drive system 29, which also receives control information signals S1 from a main control system 30. The stage drive system 29 controls the position of the XY-stage 27 in both the X- and Y-directions based on the control information signals S1 and the position information signals S2, as well as controls the position of the material support 2 in the Z-direction (and hence the focusing position of the wafer) and the tilt angle of the material support 2 based on the control information signals S1, position information signals S2 and the vertical position information signals S3.

FIG. 3(*a*) schematically shows a stage system 4 which comprises the wafer holder 1, the material support 2, the adjustable supports 3A–3C and the Z/levelling stage 5 all described above and shown in FIG. 2. When the XY-stage 27 (FIG. 2) is driven so as to move the stage system 4 and hence the wafer W in the X-direction, the stage system 4 is moved actually along a running plane 13. FIG. 3(*a*) also shows an image plane 12. This is an image plane defined by the projection optical system PL. Although it is desired that the running plane 13 and the image plane 12 be parallel to each other, they are actually nonparallel and form an angle θ between them, which has been determined and stored in a store provided in the main control system 30. Similarly, another angle formed between the image plane 12 and a running plane along which the stage system 4 is moved when the XY-stage 27 is driven so as to move the stage system 4 and hence the wafer W in the Y-direction has been determined and stored in the store provided in the main control system 30.

Referring again to FIG. 2, the projection exposure apparatus is provided with an alignment sensor system for establishing alignment of the reticle R relative to the wafer stage, which uses so-called imaging slit sensor (ISS) technique.

The ISS alignment system includes an illumination system with a light source 31 for emitting an illumination beam IE comprising light of a wavelength equal (or nearly equal) to that of the illumination beam IL for exposure. The illumination beam IE from the light source 31 is directed by a lens 32 into one end of a length of light guide 33, and guided through the light guide 33 to a position within the material support 2 and under the reference mark bearing member 8. The illumination beam IE is then emitted from the other end of the light guide 33, converged by a lens 34, and reflected by a mirror 35 to illuminate the reference marks of the reference mark bearing member 8 from the bottom side thereof. Then, respective images of the reference marks are formed through the projection optical system PL on the reticle R at positions on or ear alignment marks (including an X-axis alignment mark and a Y-axis alignment mark) provided on the reticle R.

In order to detect, for example, the position of the reticle R in the Y-direction, the main control system 30 drives the XY-stage 27 in the Y-direction so as to move (or scan) the X-axis reference mark on the XY-stage 27 relative the X-axis alignment mark on the reticle R. Some part of the illumination beam IE is allowed to pass through the X-axis alignment mark, reflected by the mirror 24, and converged by the condenser lens 23 to strike the beam splitter 22, which reflects a part of the incident illumination beam IE into a photodetector 37. The photodetector 37 produces a photo-electric detection signal Si to be supplied to an ISS processing circuit 38, which also receives the position information signals S2 from the X-axis laser interferometer 11X and the Y-axis interferometer. By using the knowledge that the photoelectric detection signal Si will have maximum magnitude when the conjugate image of the X-axis reference mark is completely overlaid on the X-axis alignment mark, the ISS processing circuit 38 determines the Y-coordinate of the material support 2 (which is the Y-coordinate of the center of the reticle R) which corresponds to the photoelectric detection signal Si of maximum magnitude, and supplies thus determined Y-coordinate to the main control system 30.

Similarly, the Y-axis reference mark is moved (or scanned) relative to the Y-axis alignment mark, while the photoelectric detection signal Si from the photodetector 37 and the position information signals S2 are monitored, so that the X-coordinate of the center of the reticle R is determined by the ISS processing circuit 38 and supplied to the main control system 30. The main control system 30 adjusts the position of the reticle R, if necessary, by controlling the position of the reticle stage 26 through a reticle-drive system (not shown).

The projection exposure apparatus is also provided with another alignment sensor system for detecting alignment marks on the wafer W (referred to as the "wafer marks" hereinafter), using off-axis alignment technique. This alignment sensor system is similar to that disclosed in Japanese published patent application No. Sho-62-171125 (No. 171125/1987) and therefore will not be described here in great detail. Briefly, the alignment sensor system comprises an alignment optical system 39 disposed at one side of the projection optical system PL, an image sensing device 40 such as a two-dimensional charge-coupled device, and a signal processing circuit 41.

The alignment optical system 39 has an optical axis extending parallel to the optical axis AX of the projection optical system PL and distant therefrom a predetermined distance to the +X-direction. The alignment optical system 39 emits an illumination beam onto the wafer W at a position on or around one of the wafer marks on the wafer W. The illumination beam comprises light forming a broad continuous spectrum of a given bandwidth. The illumination beam is reflected by the wafer mark on the wafer W to enter again into the alignment optical system 39, which forms an image of the wafer mark on a bottom surface of an indicator plate (not shown) disposed in the alignment optical system 39. The indicator plate has an indicator mark formed thereon. The image sensing device 40 mounted on the alignment optical system 39 has an image sensing surface, on which an image of the wafer mark image optically formed on the indicator plate as well as an image of the indicator mark physically formed on the indicator plate are optically formed superimposed on each other. The image sensing device 40 produces an image sensing signal Sf to the signal processing circuit 41, which also receives the position information signals S2 from the X-axis laser interferometer 11X and the Y-axis laser interferometer (not shown). The signal processing circuit 41 determines from these signals the coordinates (X, Y) of the wafer mark and supplies them to the main control system 30. The coordinates thus determined are used for performing positioning of each shot area on the wafer W.

The projection exposure apparatus is also provided with an auto-focus sensor system (referred to as the "AF sensor system" hereinafter) using obliquely-incident-beam technique, which will now be described. The obliquely-incident-beam type of AF sensor system used here comprises a light-transmitting optical system 42, a light-receiving optical system 47 and an AF signal processing circuit 52. The light-transmitting optical system 42 includes a light beam emitter unit 43 for emitting a detection light beam. The detection beam comprises light of a wavelength falling in a range within which the photoresist coated on the wafer W has substantially no sensitivity (the light may be an infrared radiation, for example). The light beam emitter unit 43 includes a light-transmitting slit plate with a slit formed therein, though which the detection beam is emitted. The detection beam then passes through a plane-parallel plate of glass 45 and a converging lens 46 to strike the wafer W at a measurement point 7, where an image of the slit is formed. In this exemplified arrangement, the measurement point 7 is selected to be on or around a point of intersection between the optical axis AX of the projection optical system PL and the surface of the wafer W.

The plane-parallel plate 45 is disposed close to the light-transmitting slit plate in the light beam emitter unit 43. Further, the plane-parallel plate 45 has two axes of rotation, one extending in the Y-direction (perpendicular to the paper surface of FIG. 2) and the other in the X-direction (parallel to the paper surface of FIG. 2), and is rotatable about each rotation axis by a small angle. There is provided a drive unit 44 for driving the plane-parallel plate 45 so as to rotate it about each rotation axis by a desired angle within a predetermined rotational angle range. The rotation of the plane-parallel plate 45 about one rotation axis and that about the other rotation axis produce the displacements of the position of the projected slit image on the wafer W, and hence of the measurement point 7 for measuring the focusing position, substantially in the X- and Y-directions, respectively.

The detection beam is reflected by the wafer W at the measurement point 7, and the reflection beam is received by the light-receiving optical system 47, within which the reflection beam passes through a converging lens 48 and a plane-parallel plate of glass 49 to enter the light beam receiver unit 50. The light beam receiver unit 50 includes a light-receiving slit plate with a slit formed therein, through which a certain part of the reflection beam passes to be detected by a photodetector. The plane-parallel plate 49 has a rotation axis extending in the Y-direction, about which it may be rotated by a drive unit 51 within a predetermined rotational angle range. The rotation of the plane-parallel plate 49 provides movement of that point on the light beam receiver unit 50 at which the reflection beam strikes it (the beam striking point) in a direction, and thereby provides adjustment of the position of the beam striking point on the light beam receiver unit 50. The direction of the movement of the beam striking point on the light beam receiver unit 50 caused by this adjustment is the same as the direction thereof caused by the displacement of the wafer W in the Z-direction. Accordingly, the adjustment of the rotational angle of the plane-parallel plate 49 is carried out such that the beam striking point may fall at the center of the detection surface of the light beam receiver unit 50 when the Z-direction position of the measurement point on the wafer W (or the focusing position) lies in the image plane of the projection optical system PL.

The light beam receiver unit 50 produces a focus signal Sa, which corresponds to the offset of the focusing position from the image plane of the projection optical system PL (i.e., the defocus amount) at the measurement point 7 on the wafer W. The focus signal Sa, as well as the position information signals S2 from the X-axis laser interferometer 11X and the Y-axis laser interferometer (not shown) are supplied to a signal processing circuit 52. The signal processing circuit 52 determines the defocus amount between the measurement point 7 on the wafer W and the image plane of the projection optical system PL and supplies it to the main control system 30. The main control system 30 controls the vertical (Z-direction) position of the Z/levelling-stage 5, by means of the stage drive system 29 and using an auto-focus technique, such that the determined defocus amount may be reduced to zero. When this vertical position control is performed, the tilt angle of the material support 2 has been adjusted such that the surface of a wafer (which is assumed to be flat) held on the top of the material support 2 is parallel to the image plane of the projection optical system PL. Further, this adjusted tilt angle of the material support 2 is kept unchanged while the XY-stage 27 is moved and/or the focusing position of the material support 2 is adjusted.

Figure 1B:
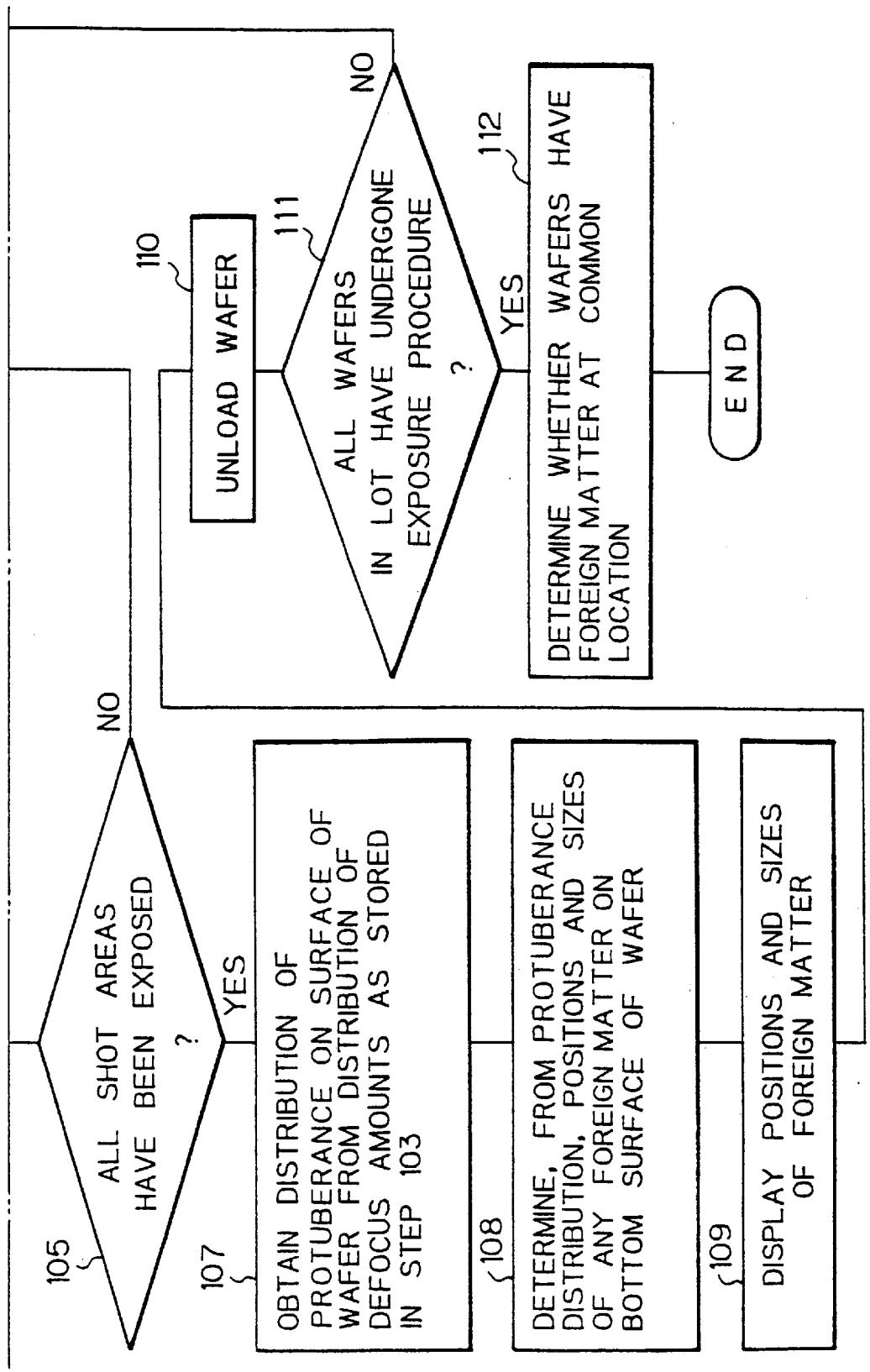

Referring next to a flow chart shown in FIG. 1, an exposure procedure according to a first embodiment of the present invention will be described, in which wafers in a single lot are processed one after another. To begin with step 101 in FIG. 1, the first one of the wafers W in the lot is transferred onto the wafer stage in the projection exposure apparatus of FIG. 2 and held on the wafer holder 1. Then, the off-axis type of alignment sensor system including the alignment optical system 39 is used to measure two-dimensional coordinates of the positions of only a preselected number of shot ares chosen from among all the shot areas on the wafer W, and the measured coordinates are used to determine two-dimensional coordinates of the positions of all the shot areas on the wafer W with great precision. Since this step is a known wafer alignment step, it will not be described in more detail.

Then, in step 102, the determined two-dimensional coordinates are used to move the XY-stage 27 in the X- and Y-directions such that the center of the shot area, to be exposed, (i.e., the shot area which is now being exposed) on the wafer W is positioned to the exposure location, which is the center of the exposure field defined by the projection optical system PL (i.e., the exposure location is a point on the optical axis AX of the projection optical system PL). In the next step 103, the AF sensor system comprising the light-transmitting optical system 42, the light-receiving optical system 47 and the AF signal processing circuit 52 is used to measure the focusing position at the center of that shot area. The measured value indicates the defocus amount of that shot area relative to the position of the image plane of the projection optical system PL (i.e., the position for focused condition). Then, the defocus amount is stored, together with the two-dimensional, X- and Y-coordinates of that shot area, in the store provided in the main control system 30. Further, the focusing operation of the wafer W is performed by operating the three adjustable supports 3A–3C on the Z/levelling-stage 5 such that the detected defocus amount may be reduced to zero.

Thereafter, in step 104, an image of the pattern of the reticle R is transferred onto that shot area by projection exposure. Then, in step 105, the main control system 30 determines whether all the shot areas on the wafer W have been exposed. If not, the procedure proceeds to step 106, where the XY-stage 27 is moved such that another shot area, to be exposed, is stepped to the exposure location in the exposure field. At the same time, the focusing position of the wafer W is corrected by means of the three adjustable supports 3A–3C on the Z/levelling-stage 5 so as to compensate for the variation in the focusing position (or vertical position) of the wafer W which could otherwise occur depending on the-angle formed between the image plane and the running plane of the wafer stage in the direction of the stepping movement.

Figure 3A:
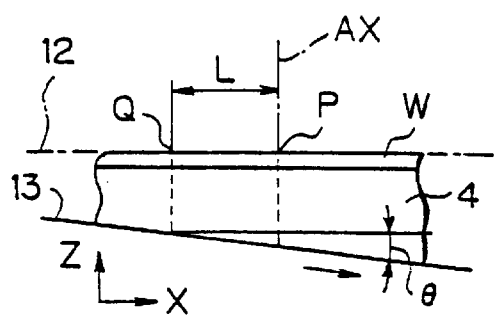
FIGS. 3(a), 3(b), 3(c) and 3(d) illustrate the principle of foreign matter detection procedure incorporated in the first embodiment of the present invention.
Figure 3B:
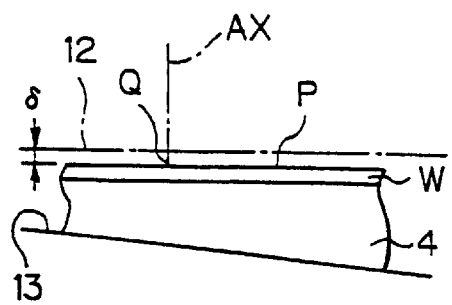

FIG. 3(a) illustrates the stage system 4 in a position which is found just before step 106 is performed. In FIG. 3(a), the shot area that has been just exposed has its center point P positioned on the optical axis AX of the projection optical system PL, and the focusing position at the center point P is located in the image plane 12 defined by the projection optical system PL so as to achieve focused condition. The next shot area, to be exposed, has its center point represented by Q. We assume here that the point P is a distance L distant from the point Q to the +X-direction. Further, the tilt angle or gradient of the running plane 13 in the X-direction relative to the image plane 12 is represented by θ[rad]. Reversely, we may use the running plane 13 as the reference plane and the tilt angle or gradient of the image plane 12 measured in the X-direction relative to the running plane 13 may be represented by θ. Starting from the position of FIG. 3(a), the stage system 4 is moved to the +X-direction along the running plane 13 to cover the distance L, and the point Q reaches the optical axis AX of the projection optical system PL (and hence the exposure location) as shown in FIG. 3(b), during which a variation δ in the focusing position (or vertical position) of the wafer W is produced, and the variation δ is expressed as:

$$\delta = L * \theta \quad (1)$$

Figure 3C:
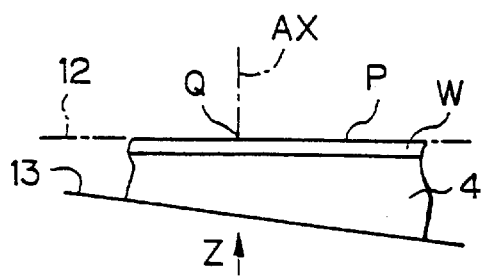
Figure 3D:
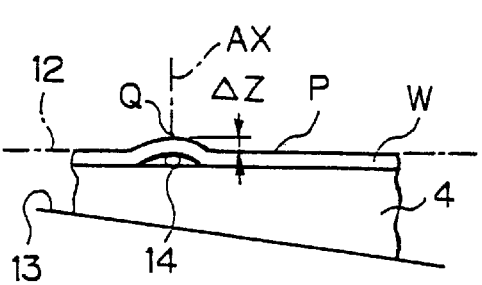

Accordingly, by introducing, during the stepping movement of the wafer W, an intentional counter variation in the focusing position of the wafer W having a magnitude equal to that variation δ, the point Q would be brought on the image plane 12 so as to achieve focused condition as shown in FIG. 3(c), provided that the wafer W is flat. However, it is possible that there happens to be foreign matter 14, such as a residue of photoresist, between the bottom surface of the wafer at the position corresponding to the point Q and the stage system 4, as shown in FIG. 3(d). In such a case, there will remain a defocus amount ΔZ substantially equal to the diameter of foreign matter 14. In the exposure procedure shown and described here, the defocus amount ΔZ is measured for each shot area so as to determine positions and size (or thicknesses) of any foreign matter existing on the bottom surface of the wafer W as describe below.

From step 106, the procedure returns to step 102, where a fine adjustment of the XY-stage 27 in the X- and Y-directions is performed in order to position another shot area, to be exposed, on the wafer W to the exposure location. Then, in step 103, the AF sensor system is used to detect the defocus amount of the center point of that shot area relative to the image plane, and the detected defocus amount is stored, together with the two-dimensional, X- and Y-coordinates of that shot area, in the store provided in the main control system 30. Further, the focusing operation of the wafer W is performed by operating the three adjustable supports 3A–3C on the Z/levelling-stage 5 such that the detected defocus amount may be reduced to zero. Then, in step 104, an image of the pattern on the reticle R is transferred onto that shot area by projection exposure. Thereafter, for any of the shot areas remaining to be exposed, the loop of operations including steps 106, 102, 103 and 104 are repeated and the defocus amount (corresponding to the defocus amount ΔZ in FIG. 3(d)) for each shot area is stored.

Eventually, step 105 determines that all the shot areas on the wafer W have been exposed. Then, the procedure proceeds to step 107, where the main control system 30 obtains the distribution of the protuberances on the surface of the wafer W from the distribution of the defocus amounts for the shot areas as measured and stored in step 103. Then, the main control system 30 determines, from the distribution of the protuberance, positions and size of any foreign matter which are considered to exist on the bottom surface of the wafer W (step 108), and display the positions and size of foreign matter on a cathode-ray-tube (CRT) display (not shown) (step 109). Alternatively, in step 107, the main control system 30 may supply the stored two-dimensional coordinates and defocus amounts of the shot areas to a host computer (not shown) which is arranged to perform foreign matter detection process of steps 107, 108 and 109.

Figure 4A:
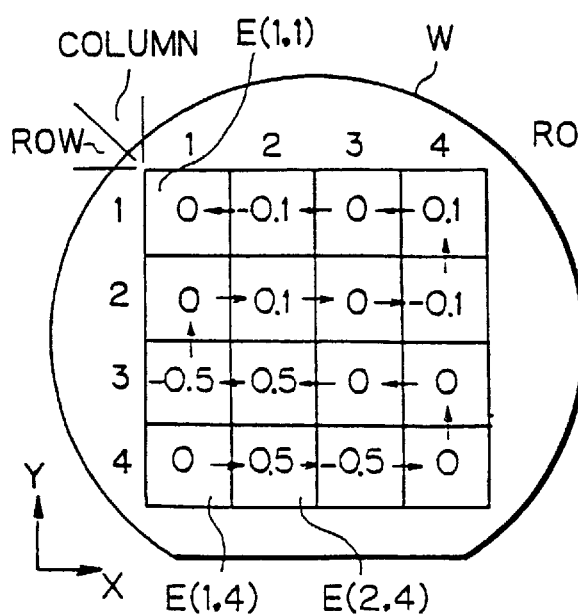
FIG. 4(a) shows an exemplified distribution of defocus amounts for the shot areas on the wafer which has been undergone the exposure procedure according to the first embodiment of the present invention.
Figure 4B:
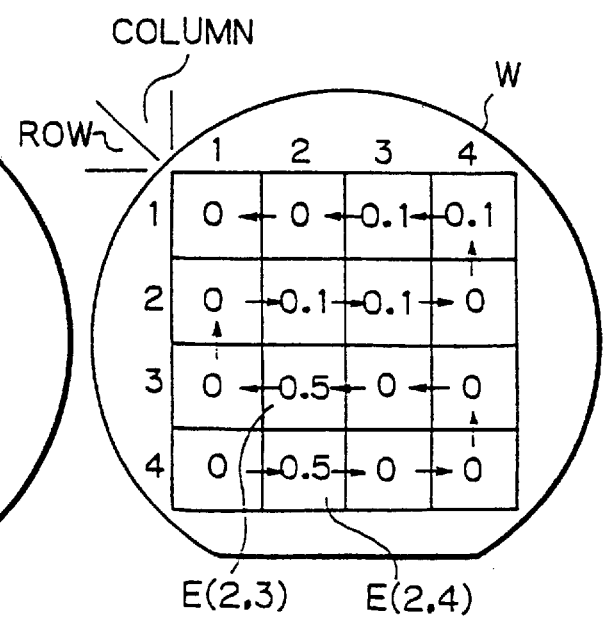
FIG. 4(b) shows an exemplified distribution of protuberances on the surface of the wafer obtained by accumulating the defocus amounts of FIG. 4(a)

Referring now to FIGS. 4(a) and 4(b), the operations in steps 107, 108 and 109 will be described in more detail with an example. FIG. 4(a) shows an exemplified arrangement of shot areas on a wafer W as well as an exemplified set of defocus amounts which may be detected for the shot areas. In FIG. 4(a), the surface of the wafer W is divided into a 4×4 array of shot areas having four rows extending in the X-direction and four columns extending in the Y-direction. Here, an expression E(i, J) is used to specify a particular shot area that is in the i-th column and in the j-th row (where i=1–4 and J=1–4); for example, the shot area in the first column and in the fourth row is specified by E(1, 4). The values written in squares corresponding to the shot areas represent the defocus amounts (μm) as stored in step 103 and the arrows bridging adjacent shot areas represent the order in the sequence of exposure operations for the shot areas; for example, the shot area E(2, 4) has a defocus amount of 0.5 μm.

More specifically, the figures written in FIG. 4(a) designates the values of defocus amounts measured for a particular shot area after the value of defocus amount for the previous shot area is corrected to zero. Thus, in order to obtain the distribution of the protuberances on the surface of the wafer W at the center points of respective shot areas, the values of defocus amounts in FIG. 4(a) have to be accumulated according to the order in the sequence of measurement operations for the shot areas.

FIG. 4(b) shows the results obtained by accumulating the defocus amounts of FIG. 4(a) according to the order in the sequence of measurement operations, and therefore the value written in each shot area indicates the height of a protuberance ($\mu$m) from a nominal upper surface of the wafer W for that shot area. In the exposure procedure of this embodiment, a threshold level Azmin for the height of the protuberance is preselected. The value greater than the threshold level $\Delta$Zmin indicates the presence of foreign matter. For example, the threshold level $\Delta$Zmin is assumed here to be selected to 0.5 $\mu$m. As shown in FIG. 4(b), the figures shown in the shot areas E(2, 4) and E(2,3) reach this threshold level $\Delta$Zmin. In this case, therefore, we determined that foreign matter exists on the bottom surface of the wafer W in a region corresponding to the shot areas E(2, 4) and E(2, 3) or the border between them, and that the size (or diameter) of foreign matter should be greater than or equal to about 0.5 $\mu$m. Alternatively, a plurality of threshold levels may be used instead of such a single threshold level $\Delta$Zmin, so that foreign matter may be classified according to their size.

Then, the distribution of the protuberances for respective shot areas and/or the classification of any foreign matter in respective shot areas are displayed on the CRT display. Where the operations in steps 107, 108 and 109 are performed by the main control system 30 of FIG. 2, the data relating to foreign matter to the host computer for on-line management of foreign matter. It is noted that any shot area in which foreign matter having a size greater than a certain allowable limit is likely to have a defective chip pattern formed thereon. Thus, it may be convenient to omit any exposure operations for such a shot area for any subsequent level layers formed on the wafer W because this advantageously avoids any useless exposure operations.

Thereafter, in step 110, the wafer W for which the exposure procedure has been completed is unloaded out of the wafer stage. Then, in step 111, it is determined whether all the wafers in the lot have undergone the exposure procedure. If not, the sequence of steps 101 through 110 is repeated for another wafer. If, however, it is determined in step 111 that all the wafer have undergone the exposure procedure, then the operation sequence proceeds to step 112 where the main control system 30 determines whether all the wafers in the lot have foreign matter at or near a common location. This is done because a certain type of foreign matter, such as a residue of photoresist, may often adhere or stick on the top surface of the wafer holder 1, resulting in that the residue of photoresist is determined as foreign matter common to all the wafers in a single lot.

If this is the case, the photoresist residue has to be removed from the wafer holder 1, or otherwise foreign matter could be detected for the wafers in the other lots to be subsequently processed, so that the yield of the products such as semiconductor devices may be lowered thereby. Therefore, if all the wafers in the lot have foreign matter detected at a location common to them, then the main control system 30 produces an alarm to a human operator indicating that there may exist foreign matter adhered on the top surface of the wafer holder 1, and the operator may respond to this by demanding the projection exposure apparatus to initiate a suitable sequence of operations such as one for cleaning the wafer holder 1 so as to remove foreign matter therefrom.

In this embodiment, as described above, the focusing position detection is performed on a single point in each shot area; however, a multi-point AF sensor system may be used to perform the focusing position detection on a plurality of measurement points in the exposure field so as to determine defocus amounts at a plurality of points in each shot area. This provides an advantage that the position of foreign matter on the bottom surface of the wafer W may be located with a higher resolution.

Further, in the case where the focusing position detection is performed on a plurality of measurement points in the exposure field in such manner, an offset in the focusing position at each measurement point between the successive shot areas may be determined. Then, the average of such offsets at all the measurement points is derived, and each measurement point is examined so as to determine whether the offset at that measurement point greatly deviates from the average. If there is found such a measurement point, it is considered that foreign matter may exist on the opposite (bottom) surface of the wafer W at a position corresponding to that measurement point.

Alternatively, in the case where the focusing position detection is performed on a plurality of measurement points in the exposure field in such manner, the dispersion of the focusing positions at the measurement points in each shot area may be determined. Then, the average of such dispersions for all the shot areas is derived, and each shot area is examined so as to determine whether the dispersion of the focusing positions for that shot area deviates from the average by more than a predetermined threshold level. If there is found such a shot area, it is considered that foreign matter may exist in that shot area.

Referring next to FIGS. 5 through 8, a second embodiment of the present invention will be described. The second embodiment may be implemented by using a projection exposure apparatus which is basically similar to the projection exposure apparatus of FIG. 2 and which further incorporates a levelling sensor system.

Figure 5:
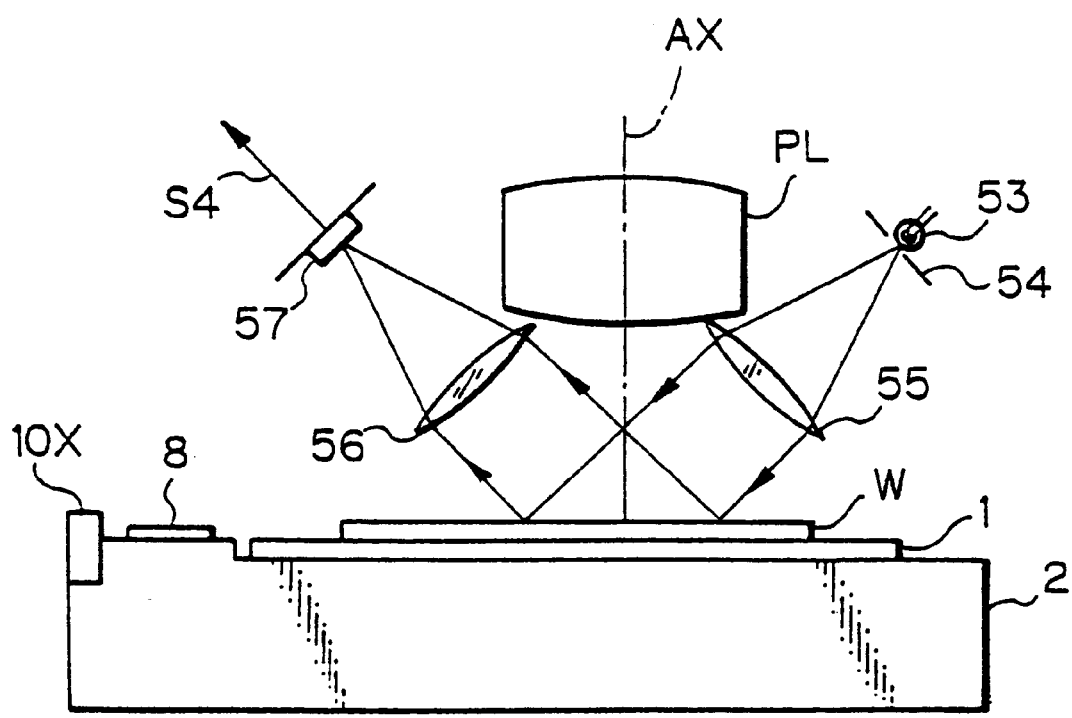
FIG. 5 is a schematic representation of a levelling sensor system which may be used for implementing the exposure procedure according to a second embodiment of the present invention.

FIG. 5 shows the levelling sensor system which may be used for an exposure procedure of the second embodiment. In FIG. 5, like parts and components are designated by like reference numerals as in FIG. 2. The levelling sensor system includes a light source 53 for emitting a detection light beam. The detection beam comprises light of a wavelength falling in a wavelength range within which the photoresist coated on the wafer W has little sensitivity. The detection beam emitted from the light source 53 is shaped by passing through a slit formed in a slit plate 54, and collimated by an objective lens 55 to illuminate the wafer W in a direction oblique with respect to the optical axis AX of the projection optical system PL. The illumination area on the wafer W illuminated by the detection beam is sufficient to cover the entire one of the shot areas on the wafer W. The detection beam is reflected by the wafer W and converged by a image forming lens 56 into a light spot on a photosensitive surface (which is divided into four partial regions) of a photodetector 57, which produces detection signals S4 indicative of the two-dimensional coordinates of the position of the light spot with respect to the photosensitive surface of the photodetector 57. The photodetector 57 supplies the detection signals S4 to the main control system 30.

In this arrangement, the position of the light spot on the photosensitive surface of the photodetector 57 varies with the tilt angle of the surface of the wafer W. Also, the levelling sensor system is calibrated such that the light spot is centered to the photosensitive surface of the photodetector 57 when the surface of the wafer W is parallel to the image plane of the projection optical system PL. Accordingly, the main control system 30 is capable of determining, based on the detection signals S4 from the photodetector 57, a pair of tilt angles (θX, θY) of the surface of the wafer W relative to the image plane of the projection optical system PL, one (θX) being the tilt angle about a first axis extending in the Y-direction and the other (θY) being the tilt angle about a second axis extending in the X-direction. The tilt angles (θX, θY) are referred to as the "two-direction tilt angles" hereinafter.

Referring now to a flow chart shown in FIG. 6, a sequence of operations for the exposure procedure according to the second embodiment will be described. To begin with step 121 in FIG. 6, a wafer W which will undergo the exposure procedure is loaded on the wafer holder 1 in the projection exposure apparatus of FIG. 2. Then, as with the first embodiment described above, a wafer alignment process is performed. Thereafter, in step 122, the XY-stage 27 is moved in the X- and Y-directions such that the center of the shot area, to be exposed, on the wafer W is positioned to the center of the exposure field defined by the projection optical system PL (i.e., to the exposure location). In the next step 123, the levelling sensor system of FIG. 5 is used to measure the two-direction tilt angles (θX, θY) of the surface of the shot area, to be exposed, with respect to the image plane of the projection optical system PL. Then, in step 124, the levelling operation of the wafer W is performed by operating the three adjustable supports 3A–3C on the Z/levelling-stage 5 such that the detected tilt angles (θX, θY) may be reduced to (0, 0). At the same time, the AF sensor system is used to determine the defocus amount of the center point of that shot area relative to the image plane, and the focusing operation of the wafer W is performed by operating the three adjustable supports 3A–3C such that the determined defocus amount may be reduced to zero.

Thereafter, in step 125, an image of the pattern on the reticle R is transferred onto that shot area by projection exposure. In the next step 126, it is determined whether all the shot areas on the wafer W have been exposed. If not, that is, if one or more shot areas remain to be exposed, then the procedure proceeds to step 127, where the main control system 30 moves the XY-stage 27 such that another shot area, to be exposed, is stepped to the exposure location. During this stepping movement, the orientation of the wafer W is kept unchanged or locked, that is, the tilt angles that have been set in order to cause the surface of the just previous shot area to be coincident with the image plane are maintained. On the other hand, the focusing position of the wafer W is corrected, like the first embodiment, by means of the three adjustable supports 3A–3C on the Z/levelling-stage 5 so as to compensate for the variation in the focusing position (or vertical position) of the wafer W which could otherwise occur depending on the angle formed between the image plane and the running plane of the wafer stage in the direction of the stepping movement. However, unlike the first embodiment, no offset in the focusing position will be used as the data for foreign matter detection in the second embodiment, so that the correction of the focusing position of the wafer W in step 127 may be omitted. Nevertheless, by performing the correction of the focusing position in parallel to performing the stepping movement of the wafer W, the average displacement of the wafer W in the Z-direction as required for the focusing operation in step 124 may be reduced, so that the required time for the focusing operation may be advantageously reduced.

From step 127, the procedure returns to step 122, where the center of the another shot area, to be exposed, on the wafer W is positioned to the exposure location. In the next step 123, the levelling sensor system is used to measure the tilt angles (θX, θY) of that shot area relative to the image plane, and the measured tilt angles are stored, together with the two-dimensional, X- and Y-coordinates of that shot area, in the store provided in the main control system 30. Then, the levelling and focusing operations are performed for that shot area in step 124, and an image of the pattern on the reticle R is transferred onto that shot area by projection exposure in the next step 125. Thereafter, for any of the shot areas remaining to be exposed, the loop of operations including steps 127, 122, 123, 124 and 125 is repeated, and the tilt angles (θX, θY) of respective surfaces of the shot areas relative to the image plane are stored.

Eventually, step 126 determines that all the shot areas on the wafer W have been exposed. Then, the procedure proceeds to step 128, where the main control system 30 obtains the distribution of the protuberances of the surface of the wafer W from the distribution of the tilt angles (θX, θY) for the shot areas as measured and stored in step 123. Then, the main control system 30 determines, from the protuberance distribution, positions and size of any foreign matter which are considered to exist on the bottom surface of the wafer W (step 129), and display the positions and size of foreign matter on the CRT display (not shown) (step 130).

Figure 7:
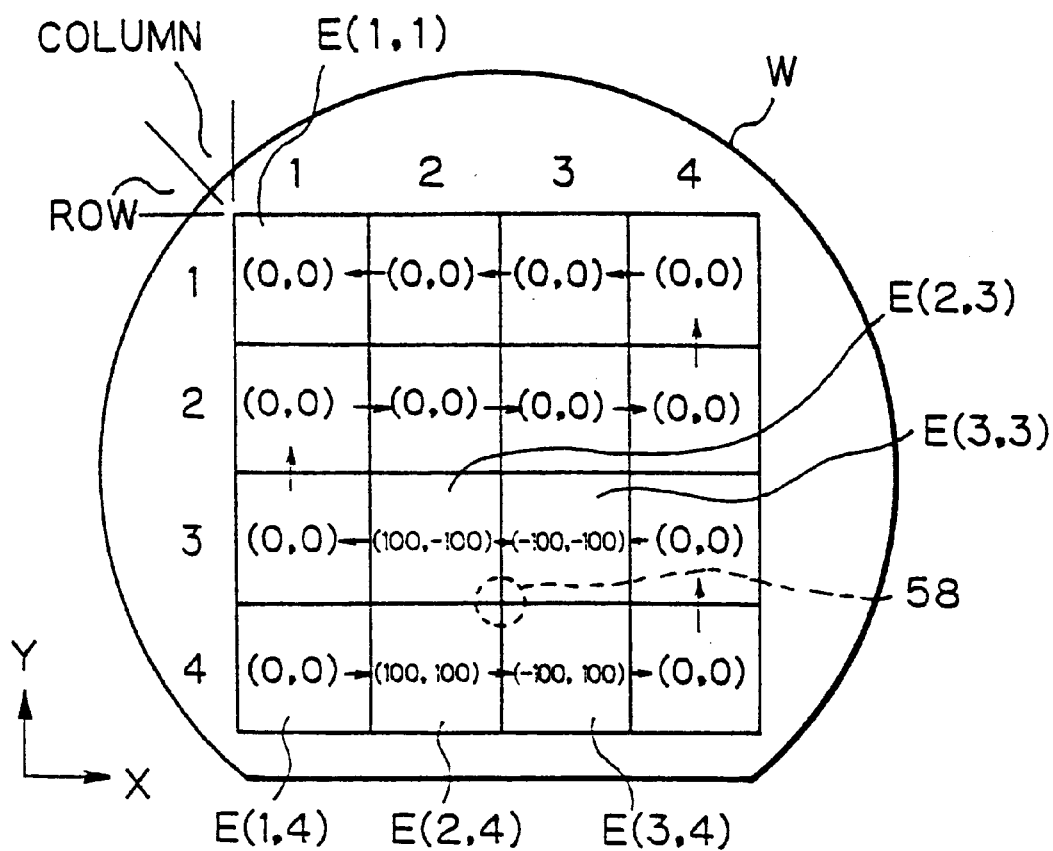
FIG. 7 shows an exemplified distribution of tilt angles ($\theta X$, $\theta Y$) for the shot areas on the wafer which has been undergone the exposure procedure according to the second embodiment of the present invention.
Figure 8:
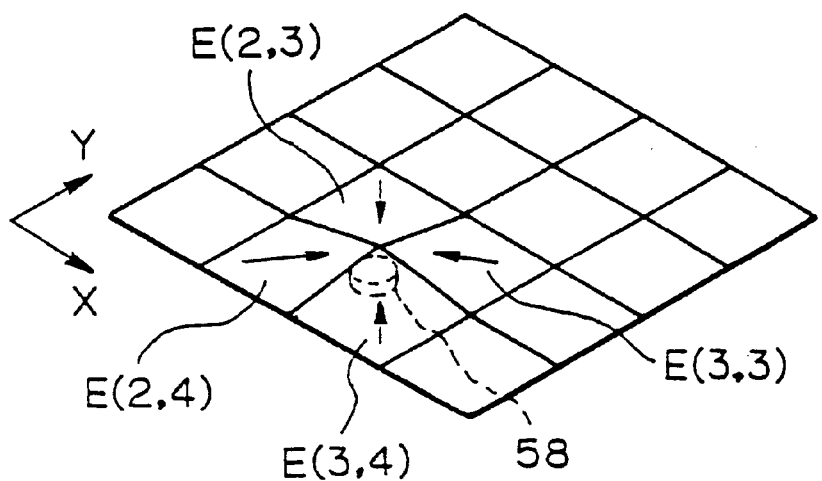
FIG. 8 shows the distribution of the tilt angles of FIG. 7 in the form of a vector distribution.

Referring now to FIGS. 7 and 8, the operations performed in steps 128, 129 and 130 will be described in more detail with an example. FIG. 7 shows an exemplified arrangement, which is similar to that of FIG. 4(*a*), of shot areas on a wafer W as well as an exemplified set of tilt angles (θX, θY) which may be detected for the shot areas. In FIG. 7, the values written in squares corresponding to the shot areas represent the tilt angles (θX, θY) (µrad) as stored in step 123 and the arrows bridging adjacent shot areas represent the order in the sequence of exposure operations for the shot areas. For example, the shot area E(2, 4) has a tilt angle θX of 100 µrad about one axis extending in the Y-direction and a tilt angle θY of 100 µrad about the other axis extending in the X-direction. As seen from FIG. 7, it may be assumed that foreign matter 58 should exist on the bottom surface of the wafer at a position corresponding to the point gathering corners of the four shot areas E(2, 3) E(3, 3), E(2, 4) and E(3,4).

For more clarity, FIG. 8 provides a perspective view illustrating the distribution of the tilt angles on the surface of the wafer W. In FIG. 8, the arrows in the above mentioned four shot areas are vectors indicating the directions of the gradients of the shot areas. It can be seen from FIG. 8 that, due to the existence of foreign matter 58, the four adjacent shot areas E(2, 3) E(3, 3), E(2, 4) and E(3,4) have their respective gradients oriented in the directions towards the point gathering their corners.

Also, in FIG. 7 it is assumed that each of the shot areas E(i, j) has a size of 20 mm×20 mm. Then, for the shot area E(2, 4), the relative height or vertical displacement ΔZ1 of the focusing position at the upper-right corner (as viewed in FIG. 7) of this shot area relative to the focusing position at the center thereof is given by:

$$\Delta Z1 \approx 2^{1/2} \times 10 \times 10^{-3} \times 100 \times 10^{-6} \text{ [m]} = 1.4 \times 10^{-6} \text{ [m]} \quad (2)$$

That is, the vertical displacement ΔZ1 equals 1.4 µm.

Thereafter, a distribution map is displayed on the CRT display in any of suitable map forms including a value map indicating the tilt angles for each shot area by values as shown in FIG. 7, a vector map indicating the tilt angles for each shot area by a vector as shown in FIG. 8, and other forms. Alternatively of additionally, vertical displacements of the focusing positions at the four corners of each shot area and/or the approximations of the positions and size of any foreign matter finally detected may be displayed.

As with the first embodiment, the second embodiment may incorporate the process of determining, after all the wafers in a single lot have undergone the exposure procedure, whether all the wafers in the lot have foreign matter at or near a common location, so as to detect any foreign matter that exist on the surface of the wafer holder.

Referring next to a flow chart of FIG. 9, a sequence of operations for an exposure procedure according to a third embodiment of the present invention will be described. The exposure procedure of the third embodiment may be implemented by using the projection exposure apparatus of FIG. 2 and the levelling sensor system of FIG. 5. Some of the steps in this exposure procedure are similar to those in the procedure of the first embodiment (FIG. 1), and thereby will not be described in detail.

Figure 9B:
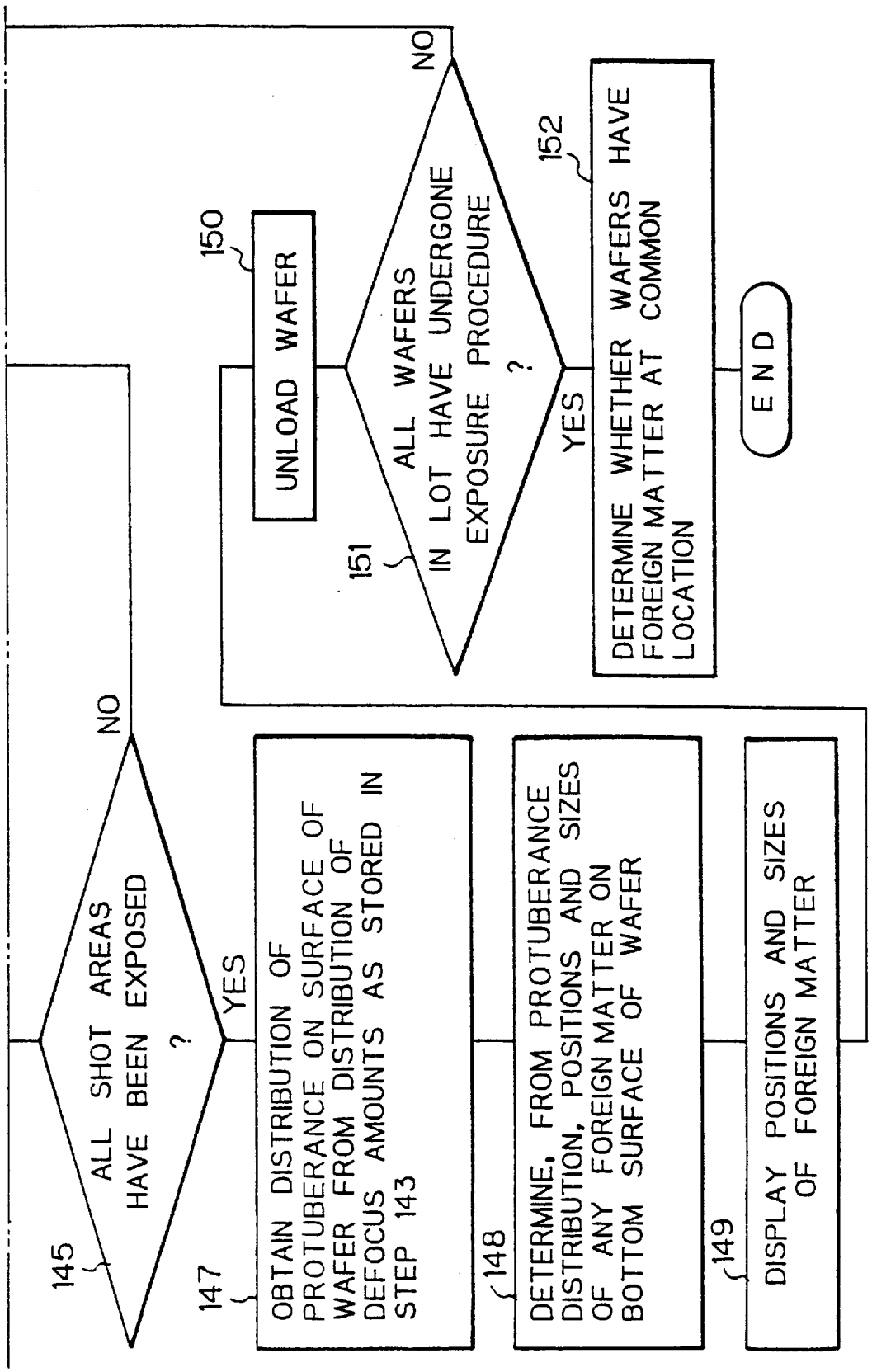

To begin with step 141 in FIG. 9, a wafer W which will undergo the exposure process is loaded on the wafer holder 1 in the projection exposure apparatus of FIG. 2. Then, as with the first embodiment described above, a wafer alignment process is performed, and the XY-stage 27 is moved in the X- and Y-directions such that the center of the shot area, to be exposed, on the wafer W is positioned to the center of the exposure field defined by the projection optical system PL (i.e., to the exposure location) (step 142). In the next step 143, the AF sensor system is used to perform the focusing operation as with the first embodiment. For this focusing operation, the focusing position is measured and the defocus amount is determined and stored, all in the same manner as the first embodiment. However, in the third embodiment, in addition to the these operations, the levelling sensor system of FIG. 5 is used to measure the tilt angles of the surface of the shot area, to be exposed. It is noted that instead of using the levelling sensor system, the tilt angles may be measured as well by determining the displacements at three driven points of the Z/levelling-stage 5 (i.e., the extension/contraction amounts of the three adjustable supports 3A–3C on the Z/levelling-stage 5). Then, a "tilt amount" is determined, by calculation, from the measured tilt angles and the distance L between the successive shot areas. The determined tilt amount is stored in the store provided in the main control system 30. The concept of the tilt amount will be described later.

Thereafter, an image of the pattern on the reticle R is transferred onto that shot area by projection exposure, as with the first embodiment. Then, in step 145, again as with the first embodiment, the main control system 30 determines whether all the shot areas on the wafer W have been exposed. If not, that is, if one or more shot areas remain to be exposed, then the procedure proceeds to step 146, where the main control system 30 moves the XY-stage 27 such that another shot area, to be exposed, is stepped to the exposure location. During this stepping movement, the position and orientation of the Z/levelling stage 5 are kept unchanged or locked, so that it is maintained at the position and orientation that have been set in order to cause the surface of the just previous shot area to be coincident with the image plane. This means that the shot area is stepped while the tilt amount that has been measured in step 143 is maintained.

From step 146, the procedure returns to step 142. Thus, the loop including steps 142 through 146 is repeated until all the shot areas on the wafer W have been exposed.

Referring again to FIGS. 3(a) through 3(d), the method of detecting foreign matter will be described in detail. FIG. 3(a) shows the stage system 4 in a condition which is found just before the operation in step 146 is performed. As previously described in connection with the first embodiment, starting from the position of FIG. 3(a), the stage system 4 is moved to the +X-direction along the running plane 13 to cover the distance L, and the point Q reaches the optical axis AX of the projection optical system PL (and hence the exposure location) as shown in FIG. 3(b), during which a variation δ in the focusing position (or vertical position) of the wafer W is produced. The variation δ is determined by i) the tilt amount of the surface of the shot area as measured and stored under the condition of FIG. 3(a), ii) the spacing L between the shot areas and iii) the tilt angle of the running plane 13 of the stage system. Both the spacing L between the shot areas and the tilt angle of the running plane 13 of the stage system have constant design values. Whereas, the tilt amount of the shot area is the vertical displacement of the center point Q of the shot area which is distant away by the spacing L between the shot areas, when the tilt angle of the surface of the shot area relative to the image plane 12 measured by the levelling sensor shown in FIG. 5 is corrected. Therefore, provided that the substrate (i.e., wafer) W is flat, the difference ΔZ between the defocus amount ΔZ' measured at the point Q and the variation δ (i.e., ΔZ=ΔZ'−δ) will be zero (i.e., ΔZ=0). However, when there is foreign matter 14 between the substrate W and the substrate stage 4 as shown in FIG. 3(d), a non-zero defocus amount ΔZ is measured between the point Q and the image plane 12, from which the existence of foreign matter may be detected.

Eventually, step 145 determines that all the shot areas on the wafer W have been exposed. Then, the procedure proceeds to step 147, where the main control system 30 obtains the distribution of the protuberances of the surface of the wafer W from the distribution of the defocus amounts for the shot areas as measured and stored in step 143. Then, the main control system 30 determines, from the protuberance distribution, positions and size of any foreign matter which are considered to exist on the bottom surface of the wafer W (step 148), and display the positions and size of foreign matter on the CRT display (not shown) (step 149).

Further, step 148 may incorporate an additional process of obtaining the distribution of the tilt amounts stored in step 143 in addition to the obtaining the distribution of the defocus amounts, based on which the positions of foreign matter are displayed on the CRT display in step 149. In this manner, the position of foreign matter within a shot area may be detected, and thus foreign matter detection may be achieved with greater precision.

It will be understood that the present invention may be applied not only to the type of projection exposure apparatus in which positioning of a wafer is performed in order for step-and-repeat exposure technique (such as steppers), but also to another type of projection exposure apparatus including those using step-and-scan exposure technique in which a reticle and a wafer are moved for scanning relative to a projection optical system.

In either of the exposure methods according to the first and third embodiments of the present invention, a substrate (wafer) is moved from a position for exposure of a first shot area to another position for subsequent exposure of a second shot area, when the vertical position of the substrate is corrected by an amount corresponding to the tilt angle (or offset) of the given running plane of the substrate stage relative to the image plane of the projection optical system, and then the defocus amount of the surface of the substrate relative to the image plane is measured before the focusing operation for the second shot area is performed. If the defocus amount thus measured has a non-zero value, it is mainly due to foreign matter existing on the bottom surface of the substrate. Accordingly, these methods provide an advantage that any foreign matter existing on the bottom of the substrate may be detected merely by measuring the focusing positions on the substrate by using, for example, an AF sensor system which is generally provided in an ordinary projection exposure apparatus, and hence without need for using any special detection device designed for foreign matter detection purpose. When the size (or diameter) of detected foreign matter exceeds a predetermined limit, the shot area in which foreign matter is detected may be considered to be a defective shot area. Therefore, the present invention provides another advantage that such defective shot areas may be identified before final examination of the finished chip patterns on the substrate.

In the case where the second and third steps are repeated for a plurality of shot areas on the substrate so as to obtain a plurality of defocus amounts, and the plurality of defocus amounts are used to detect any foreign matter existing between the substrate and the substrate stage, then, a distribution of foreign matter on the entire bottom surface of the substrate may be advantageously detected.

Further, in the case where foreign matter detection is performed in this manner for all the substrates (such as wafers) in a single lot, and it is determined whether the substrates have foreign matter positioned at a location common to them, then, there is provided an advantage that any foreign matter adhered or stuck on a substrate holder (such as a wafer holder) may be detected.

Moreover, in the case where the second and third steps are repeated so as to obtain a plurality of defocus amounts, the plurality of defocus amounts are used to obtain a distribution of tilt angles on the surface of the substrate, the tilt angle distribution thus obtained is used to determine, by calculation, positions and size of any foreign matter existing between the substrate and the substrate stage, and the positions and size of foreign matter thus determined are displayed on a display, then, there is provided an advantage that foreign matter may be detected with precision even when that foreign matter is at such position on the bottom surface of the substrate that corresponds to the border between adjacent shot areas.

In the exposure method according to the second embodiment of the present invention, a substrate (wafer) is moved from a position for exposure of a first shot area to another position for subsequent exposure of a second shot area, with the tilt angle of the substrate being kept unchanged or locked, and then the tilt angle of the surface of the substrate relative to the image plane is measured before the levelling and focusing operations for the second shot area are performed. If the tilt angle thus measured has a non-zero value, it is mainly due to foreign matter existing on the bottom surface of the substrate. Accordingly, this method provides an advantage that any foreign matter existing on the bottom of the substrate may be detected merely by measuring the tilt angles on the substrate by using, for example, a levelling sensor system which is generally provided in an ordinary projection exposure apparatus, and hence obviating the need for any special detection device. This method also provides an advantage that any defective shot areas due to foreign matter may be identified by assumption.

It is to be understood that the present invention is not limited to the embodiments described above, but may be embodied in various other formes without departing from the spirit and the scope of the present invention.

What is claimed is:

1. An exposure method wherein a pattern formed on a mask is sequentially transferred onto a plurality of shot areas on a substrate through a projection optical system, said method comprising:

a first step including moving a first shot area on said substrate into an exposure field of said projection optical system, causing the surface of said substrate and an image plane of said projection optical system to be coincident with each other at a predetermined measurement point in said exposure field so as to achieve focused condition, and transferring said mask pattern onto said first shot area by projection exposure;

a second step including moving said substrate along a predetermined running plane by means of said substrate stage so as to move a second shot area on said substrate into said exposure field of said projection optical system, compensating, during the movement of the substrate stage, an offset between said running surface and said image plate of said projection optical system, and measuring and storing a defocus amount between the surface of said substrate and said image plane of said projection optical system at said predetermined measurement point; and a third step including causing the surface of said substrate and said image plane of said projection optical system to be coincident with each other at said predetermined measurement point so as to achieve focused condition, and transferring said mask pattern onto said second shot area by projection exposure.

2. An exposure method according to claim 1, further comprising the steps of:

repeating said second step and said third step for a plurality of shot areas on said substrate so as to obtain a plurality of defocus amounts; and detecting from said plurality of defocus amounts the existence of any foreign matter existing between said substrate and said substrate stage.

3. An exposure method according to claim 2, further comprising the steps of:

repeating said second step and said third step so as to obtain a plurality of defocus amounts;

obtaining from said plurality of defocus amounts a distribution of tilt angles on the surface of said substrate;

determining, by calculation, from said distribution thus obtained, positions and size of any foreign matter existing between said substrate and said substrate stage; and displaying said positions and size of foreign matter thus determined on a display.

4. An exposure method wherein a pattern formed on a mask is sequentially transferred onto a plurality of shot areas on a substrate through a projection optical system, said method comprising:

a first step including moving a first shot area on said substrate into an exposure field of said projection optical system, adjusting a vertical position and a tilt angle of the surface of said substrate to those of an image plane of said projection optical system, and transferring said mask pattern onto said first shot area by projection exposure;

a second step including moving said substrate along a predetermined running plane by means of said substrate stage with said tilt angle of the surface of said substrate being kept unchanged so as to move a second shot area on said substrate into said exposure field, measuring and storing said tilt angle of the surface of said substrate relative to said image plane in said exposure field, and thereafter adjusting said vertical position and said tilt angle of the surface of said substrate to those of said image plane and transferring said mask pattern onto said second shot area by projection exposure;

a step of repeating said second step for a plurality of shot areas on said substrate so as to obtain a distribution of a plurality of tilt angles and using said distribution so as to detect any foreign matter existing between said substrate and said substrate stage.

5. An exposure method wherein a pattern formed on a mask is sequentially transferred onto a plurality of shot areas on a substrate through a projection optical system, said method comprising:

a first step including moving a first shot area on said substrate into an exposure field of said projection optical system, adjusting a vertical position of the surface of said substrate to that of an image plane of said projection optical system, storing a tilt amount of the surface of said substrate relative to said image plane, and transferring said mask pattern onto said first shot area by projection exposure;

a second step including moving said substrate along a predetermined running plane by means of said substrate stage with said tilt amount of said substrate being kept unchanged so as to move a second shot area on said substrate into said exposure field of said projection optical system, and measuring and storing a defocus amount between the surface of said substrate and said image plane of said projection optical system at a predetermined measurement point; and a third step including making the surface of said substrate and said image plane of said projection optical system coincident with each other at said predetermined measurement point so as to achieve focusing condition, and transferring said mask pattern onto said second shot area by projection exposure.

6. An exposure method according to claim 5, wherein:
said tilt amount is determined, by calculation, from i) tilt angle of the shot area relative to said image plane and ii) spacing between the shot areas.

7. An exposure method according to claim 5, further comprising the steps of:
repeating said first step, said second step and said third step for a plurality of shot areas on said substrate so as to obtain a plurality of defocus amounts; and
detecting from said plurality of defocus amounts the existence of any foreign matter existing between said substrate and said substrate stage.

8. An exposure method according to claim 7, further comprising the steps of:
repeating said first step, said second step and said third step so as to obtain a plurality of tilt amounts and a plurality of defocus amounts;
obtaining, from said plurality of tilt amounts and said plurality of defocus amounts, distributions of tilt amounts and defocus amounts on the surface of said substrate;
determining, by calculation, from said distributions thus obtained, positions and size of any foreign matter existing between said substrate and said substrate stage; and
displaying said positions and size of foreign matter thus determined on a display.

9. An exposure method wherein an image of a pattern formed on a mask is transferred onto a plurality of shot areas on a substrate through a projection optical system, said method comprising the steps of:

moving, after said pattern is transferred to a first shot area on said substrate, a substrate stage on which said substrate is supported so that the image of said pattern is transferred to a second shot area which is next to said first shot area; and controlling, during the movement of said substrate stage, said substrate stage in the direction substantially perpendicular to an image plane formed by said projection optical system based on information stored in advance.

10. An exposure method according to claim 9, wherein said information includes information on fluctuation of said substrate stage which is caused in the direction substantially perpendicular to said image plane during the movement of said substrate stage.

11. An exposure method according to claim 10, wherein said substrate stage moves along a predetermined running plane and said information on fluctuation of said substrate stage includes information on a positional relationship between said image plane and said running plane.

12. An exposure method according to claim 11, wherein said positional relationship includes an inclination of said running plane with respect to said image plane.

13. An exposure method according to claim 9, wherein said information includes information on said running plane.

14. An exposure method according to claim 13, wherein said substrate stage moves along a predetermined running plane and said information on said running plane includes information on a positional relationship between said image plane and said running plane.

15. An exposure method according to claim 9, further comprising the step of achieving a focused condition between said second shot area and said image plane formed by said projection optical system before transferring said pattern to said second shot area, said control of said substrate stage being carried out before achieving said focused condition between said second shot area and said image plane.

16. An exposure method according to claim 15, further comprising the steps of:
detecting, when achieving said focused condition, a deviation amount of said second shot area from said image plane; and
detecting any foreign matter existing between said substrate and said substrate stage by the existence of said deviation amount.

17. An exposure method according to claim 16, further comprising the steps of:
repeating said step of detecting any foreign matter in a plurality of shot areas on said substrate; and
obtaining at least one of a distribution of positions of any foreign matter, a distribution of size of any foreign matter and a distribution of tilt angles on the surface of said substrate.

18. An exposure method according to claim 9, wherein said image of the pattern is transferred to said substrate with said substrate stage remaining stationary.

19. An exposure method wherein a pattern formed on a mask is sequentially transferred onto a plurality of shot areas on a substrate through a projection optical system, said method comprising the steps of:

moving a first shot area on said substrate into an exposure field of said projection optical system so that a surface of said first shot area is brought into coincidence with an image plane formed by said projection optical system;

exposing said first shot area by projecting said mask pattern onto said first shot area;

moving a substrate stage on which said substrate is supported along a predetermined running plane so that a second shot area on said substrate is moved into said exposure field; and adjusting, during said movement of said substrate stage, a vertical position of said substrate by means of said substrate stage so that a deviation amount of said running surface from said image plane is eliminated.

20. An exposure method according to claim 19, further comprising the steps of:

measuring, after said adjusting step, a defocus amount between the surface of said second shot area which has been moved into said exposure field and said image plane;

achieving a focused condition between the surface of said second shot area and said image plane; and detecting from said measured defocus amount any foreign matter existing between said substrate and said substrate stage.

21. An exposure method according to claim 20, further comprising the steps of:

repeating said step of detecting any foreign matter in a plurality of shot areas on said substrate; and obtaining at least one of a distribution of positions of any foreign matter, a distribution of size of any foreign matter, and a distribution of tilt angles on the surface of said substrate.

* * * * *

UNITED STATES PATENT AND TRADEMARK OFFICE
CERTIFICATE OF CORRECTION

PATENT NO.     : 6,287,734 B1
DATED          : September 11, 2001
INVENTOR(S)    : Yuji Imai It is certified that error appears in the above-identified patent and that said Letters Patent is hereby corrected as shown below:

<u>Title page,</u>
Change "[30] Foreign Application Priority Data"
Jun. 6 1996   (JP) .................................. 8-043951"

to be

-- [30] Foreign Application Priority Data"
Jun. 6 1996   (JP) .................................. 8-143951 -- and also change

"       Related U.S. Application Priority Data
[63] Continuation of application No. 09/333,985, filed on Jun. 16, 1999, which is ..."

to be

--      Related U.S. Application Priority Data
[63] Continuation of application No. 09/333,985, filed on Jun. 16, 1999, now
     abandoned, which is .... --

Signed and Sealed this

Thirtieth Day of April, 2002

Attest:

JAMES E. ROGAN
*Attesting Officer*   *Director of the United States Patent and Trademark Office*